United States Patent
Marumo

(10) Patent No.: US 7,991,219 B2
(45) Date of Patent: Aug. 2, 2011

(54) METHOD AND APPARATUS FOR DETECTING POSITIONS OF ELECTRODE PADS

(75) Inventor: Yoshihito Marumo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 863 days.

(21) Appl. No.: 12/017,642

(22) Filed: Jan. 22, 2008

(65) Prior Publication Data

US 2009/0010525 A1 Jan. 8, 2009

(30) Foreign Application Priority Data

Feb. 2, 2007 (JP) .................................. 2007-024238

(51) Int. Cl.
*G06K 9/00* (2006.01)
(52) U.S. Cl. ...................................................... 382/151
(58) Field of Classification Search ............ 382/141–151
See application file for complete search history.

(56) References Cited

U.S. PATENT DOCUMENTS

| 5,627,913 | A  | * | 5/1997 | Spigarelli et al. | ............. 382/151 |
| 7,528,943 | B2 | * | 5/2009 | Brown et al. | ............. 356/237.4 |
| 2004/0081349 | A1 | | 4/2004 | Chaya et al. | |
| 2006/0139628 | A1 | | 6/2006 | Chaya et al. | |

FOREIGN PATENT DOCUMENTS

| JP | 2005-45194 | 2/2005 |
| KR | 10-2005-0055041 | 6/2005 |

* cited by examiner

*Primary Examiner* — Michael P Stafira
(74) *Attorney, Agent, or Firm* — Oblon, Spivak, McClelland, Maier & Neustadt, L.L.P.

(57) ABSTRACT

A method for detecting positions of a plurality of electrode pads of semiconductor chips formed on a semiconductor wafer includes: setting an imaging target region greater than a semiconductor chip on the semiconductor wafer; performing split imaging so as to entirely cover the imaging target region; and detecting positions of electrode pads of the semiconductor chip by processing images obtained by the split imaging. The split imaging is performed by using an imaging device which enlarges and images a region smaller than the imaging target region by one imaging.

11 Claims, 10 Drawing Sheets

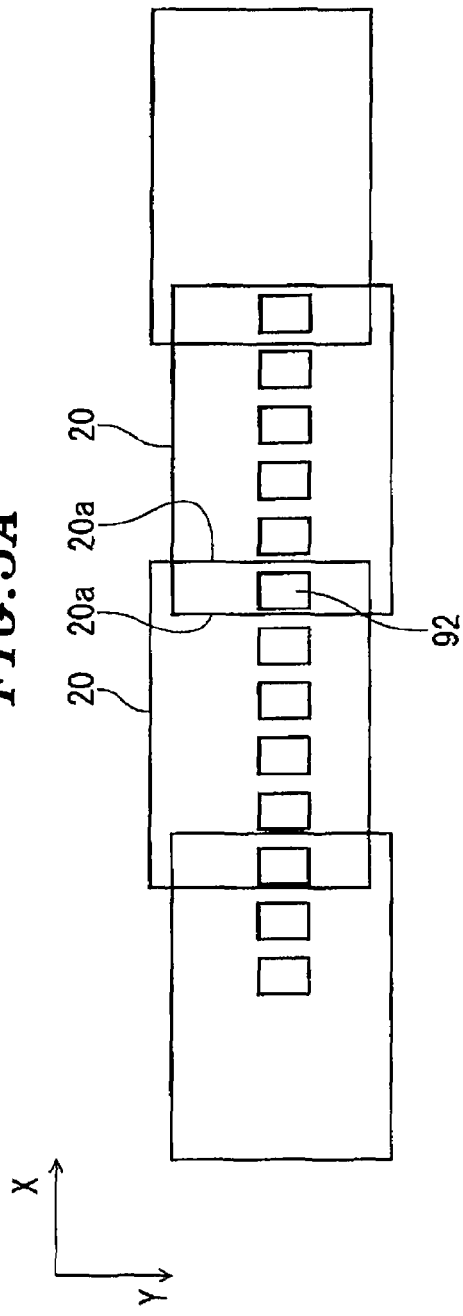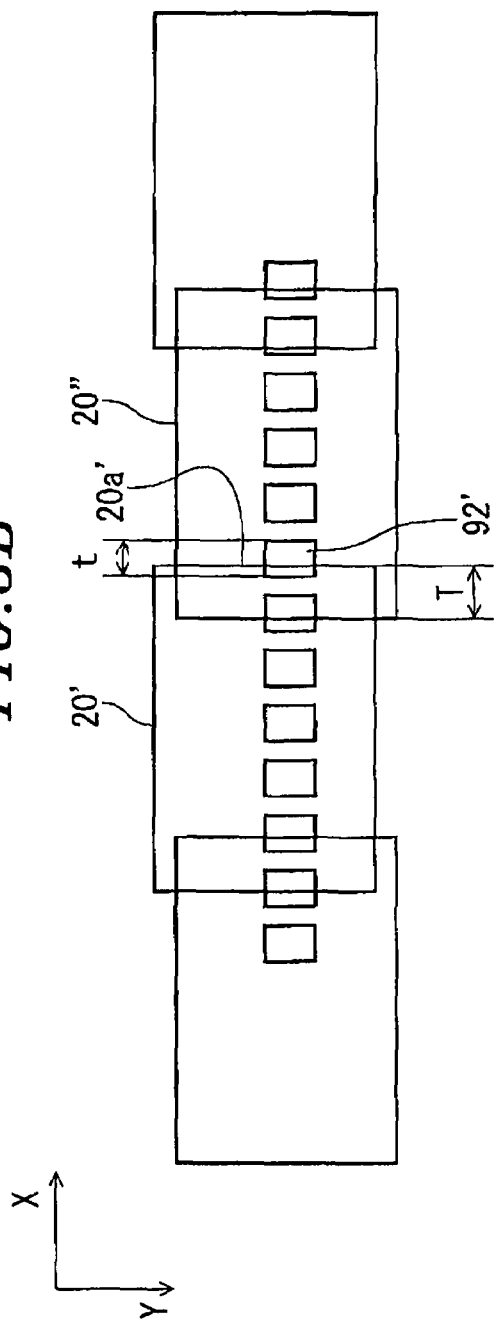

METHOD AND APPARATUS FOR DETECTING POSITIONS OF ELECTRODE PADS

FIELD OF THE INVENTION

The present invention relates to a method and an apparatus for detecting positions of electrode pads; and, more particularly, to a method for detecting positions of electrode pads by using an imaging device.

BACKGROUND OF THE INVENTION

Generally, a semiconductor wafer W has thereon a plurality of rectangular-shaped semiconductor chips 91 (FIG. 9A). Each of the semiconductor chips 91 is provided with about 100 to about 500 rectangular-shaped electrode pads 92 (FIG. 9B). In order to guarantee quality of a semiconductor chip 91, electrical characteristics of the semiconductor chip 91 are tested before it is cut out from a semiconductor wafer W.

In order to test the electrical characteristics of the semiconductor chip 91, a needle-shaped testing probe 93 contacts with each of the electrode pads 92 of the corresponding semiconductor chip 91 (FIG. 9C). Here, the electrode pad 92 is generally made of a thin aluminum film, so that a surface thereof is made to be coated with an insulating aluminum oxide film formed by natural oxidation. Accordingly, in order to make the testing probe 93 pass through the aluminum oxidation film, a specific level of force is applied when the testing probe 93 contacts with the electrode pad 92. As a result, a needle mark 94 is formed on the electrode pad 92 by the testing probe 93 (FIG. 9D). By checking whether the needle mark 94 exists or not and also by checking a position, a depth or the like thereof, it is determined whether or not the testing probe 93 has accurately contacted with the electrode pad 92.

If the testing probe 93 contacts with the electrode pad 92 multiple times, a hole may be formed on the electrode pad 92 made of the thin aluminum film. To that end, the testing probe 93 needs to contact with the electrode pad 92 while avoiding previously formed needle marks 94. Therefore, before testing the electrical characteristics of the semiconductor chip 91, it is required to check the positions or the like of the needle marks 94 on each of the electrode pads 92 (needle mark inspection).

As for a method for efficiently performing the needle mark inspection, there is known a method for checking positions or the like of needle marks by following procedures: consecutively moving a stage for mounting thereon a semiconductor wafer until a focus of a camera disposed to face the stage becomes close to electrode pads; illuminating the electrode pads by flashlight of the camera when the focus of the camera is close to the electrode pads; capturing images of the electrode pads; and analyzing the captured images of the electrode pads (see, e.g., Japanese Patent Laid-open Application No. 2005-45194). In order to implement this method, it is required to detect or recognize in advance the positions of the electrode pads.

As for a conventional method for detecting or recognizing positions of electrode pads, there is known a method for capturing an image of a semiconductor wafer by a camera and enlarging the captured image to thereby define positions of electrode pads on the corresponding image by using a pointing device such as a mouse or the like, or a method for inputting position coordinate data of electrode pads on each semiconductor chip to an inspection device for performing needle mark inspection.

Recently, due to an increase of inspection items in the electrical characteristics test, a semiconductor chip inspection is performed by an inspection company (test house) different from a semiconductor chip manufacturing company. However, position data of electrode pads are generally not included in semiconductor chip data supplied from the manufacturing company to the inspection company. Therefore, the inspection company uses the former method to define positions of electrode pads on an image.

Meanwhile, a single semiconductor chip has about 100 to about 500 electrode pads, so that the operation of defining positions of electrode pads on an image requires a considerable amount of labor from an operator. As a result, it is difficult to detect the positions of all the electrode pads of the semiconductor chip.

SUMMARY OF THE INVENTION

In view of the above, the present invention provides a method and an apparatus for detecting positions of electrode pads, capable of easily detecting positions of all electrode pads of a semiconductor chip.

In accordance with one aspect of the present invention, there is provided a method for detecting positions of a plurality of electrode pads of semiconductor chips formed on a semiconductor wafer, the method including:

setting an imaging target region greater than a semiconductor chip on the semiconductor wafer;

performing split imaging so as to entirely cover the imaging target region by using an imaging device which enlarges and images a region smaller than the imaging target region by one imaging; and detecting positions of electrode pads of the semiconductor chip by processing images obtained by the split imaging.

In accordance with another aspect of the present invention, there is provided an apparatus for detecting positions of a plurality of electrode pads of semiconductor chips formed on a semiconductor wafer, the apparatus including:

a control unit for setting an imaging target region greater than a semiconductor chip on the semiconductor wafer; and an imaging device for enlarging and imaging a region smaller than the imaging target region by one imaging, wherein the imaging device performs split imaging so as to entirely cover the imaging target region, and the control unit detects positions of electrode pads of the semiconductor chip based on the images obtained by the split imaging.

In accordance with the aspects of the present invention, the split imaging is performed so that the imaging target region greater than a semiconductor chip can be entirely covered, and the positions of the electrode pads are detected by performing the imaging processing on the images obtained by the split imaging. Accordingly, the positions of the electrode pads can be detected without locating them in the images. In addition, since the split imaging is performed so that the imaging target region can be entirely covered, all the electrode pads of the semiconductor chip are included in the images obtained by the split imaging. From the above, it is possible to easily detect the positions of all the electrode pads of the semiconductor chip.

Preferably, the method further includes capturing, before setting the imaging target region, an image of a region including at least the semiconductor chip and displaying the captured image of the region, wherein in setting the imaging target region, a single point corresponding to the semiconductor chip on the displayed image is set as a reference point of the imaging target region, and the imaging target region is set based on the set reference point and preset data on dimensions of the semiconductor chip.

As described, the image of the region including a plurality of semiconductor chips is displayed, and a single point corresponding to a semiconductor chip on the displayed image is set as a reference point of the imaging target region. Then, the imaging target region is set based on the set reference point and the preset data on dimensions of the semiconductor chip. Therefore, the labor of the operator can be decreased because it is only required for the operator to designate the single point on the displayed image as the reference point of the imaging target region.

Preferably, the method further includes capturing, before setting the imaging target region, an image of a region including at least the semiconductor chip and displaying the captured image of the region, wherein in setting the imaging target region, the imaging target region is set to a region surrounding the semiconductor chip on the displayed image.

As described, the image of the region including a plurality of semiconductor chips is displayed, and the imaging target region is set to a region surrounding a semiconductor chip on the displayed image. Therefore, the labor of the operator can be decreased because the operator only needs to surround the region corresponding to the semiconductor chip on the displayed image by using a pointing device or the like.

Preferably, the method further includes capturing, before setting the imaging target region, an image of a region including at least the semiconductor chip and displaying the captured image of the region, wherein in setting the imaging target region, the imaging target region is set by using two designated points on the displayed image as two diagonal points of a rectangular region corresponding to the semiconductor chip.

As described, the image of the region including a plurality of semiconductor chips is displayed, and the imaging target region is set by using two designated points on the displayed image as two diagonal points of the rectangular region corresponding to the semiconductor chip. At this time, the operator only needs to designate the two points on the displayed image, so that the labor of the operator can be decreased.

Preferably, the method further includes detecting shapes of the electrode pads by processing the images obtained by the split imaging.

As described, the shapes of the electrode pads are detected by processing the images obtained by the split imaging. Therefore, the shapes of the electrode pads can be easily detected.

Preferably, the method further includes displaying the detected shapes of the electrode pads.

As described, the detected shapes of the electrode pads are displayed, so that the operator can easily determine whether or not the shapes of the electrode pads are detected accurately.

Preferably, the method further includes overlappedly displaying the detected shapes of the electrode pads with the images obtained by the split imaging.

As described, the detected shapes of the electrode pads are overlappedly displayed with the images obtained by the split imaging. Therefore, the operator can easily determine whether or not the control unit erroneously detects other parts as the electrode pads.

Preferably, the method further includes overlappedly displaying the detected shapes of the electrode pads with an entire image of the semiconductor chip.

As described, the detected shapes of the electrode pads are overlappedly displayed with the entire image of the semiconductor chip. Thus, the operator can easily determine whether the positions of the electrode pads as well as the shapes thereof are detected accurately.

Preferably, in performing the split imaging, at least parts of the adjacent regions to be split-imaged are overlapped with each other.

As described, when the split imaging of the split imaging target region is performed, at least parts of the adjacent split imaging regions are overlapped with each other, so that the entire split imaging target region can be imaged without skipping parts thereof. Accordingly, it is possible to accurately detect the positions of all the electrode pads of the semiconductor chip.

Preferably, overlap values between the adjacent regions to be split-imaged are greater than dimensions of the electrode pad.

As described, the overlap values between the adjacent split imaging regions are greater than dimensions of an electrode pad and, thus, the electrode pad is not divided in at least one of the images of the split imaging regions. As a result, it is not required to correct the shapes of the electrode pads, thereby reducing the efforts required therefor.

BRIEF DESCRIPTION OF THE DRAWINGS

The above and other objects and features of the present invention will become apparent from the following description of embodiments, given in conjunction with the accompanying drawings, in which:

FIGS. 3A and 3B respectively illustrate a preliminarily imaged region, wherein FIG. 3A illustrates an imaged state thereof, and FIG. 3B illustrates a state in which a single vertex on a semiconductor chip which is an object of split imaging is defined as a reference point of a split imaging target region;

FIGS. 4A and 4B respectively illustrate a split imaging target region, wherein FIG. 4A illustrates the split imaging target region whose reference point is set to a single vertex on a semiconductor wafer, and FIG. 4B illustrates an arrangement of a plurality of split imaging regions;

FIGS. 5A and 5B respectively illustrate a diagram for explaining a relationship between an overlap value between adjacent split imaging regions and a position of the electrode pads, wherein FIG. 5A illustrates a case where edges of the adjacent split imaging regions are not laid on the electrode pads, and FIG. 5B illustrates a case where the edges of the adjacent split imaging regions are laid on the electrode pads;

FIGS. 6A and 6B respectively illustrate an enlarged image of the split imaging regions, wherein FIG. 6A illustrates a case where contours indicating detected positions and shapes of the electrode pads are overlappedly displayed, and FIG. 6B illustrates a case of surrounding and defining regions corresponding to the electrode pads by contours;

FIGS. 7A and 7B respectively illustrate a modified example of a method for setting a split imaging target region, wherein FIG. 7A illustrates a first modified example, and FIG. 7B illustrates a second modified example;

FIGS. 9A to 9D respectively illustrate a semiconductor chip to be subjected to an electrical characteristics test, wherein FIG. 9A illustrates a relationship between a semiconductor wafer and a semiconductor chip; FIG. 9B illustrates a relationship between a semiconductor chip and an electrode pad; FIG. 9C illustrates a testing probe for use in the electrical characteristics test; and FIG. 9D illustrates a needle mark on an electrode pad.

DETAILED DESCRIPTION OF THE EMBODIMENTS

Embodiments of the present invention will be described with reference to the accompanying drawings which form a part hereof.

To begin with, an apparatus for detecting positions of electrode pads in accordance with an embodiment of the present invention will be described.

Figure 1:
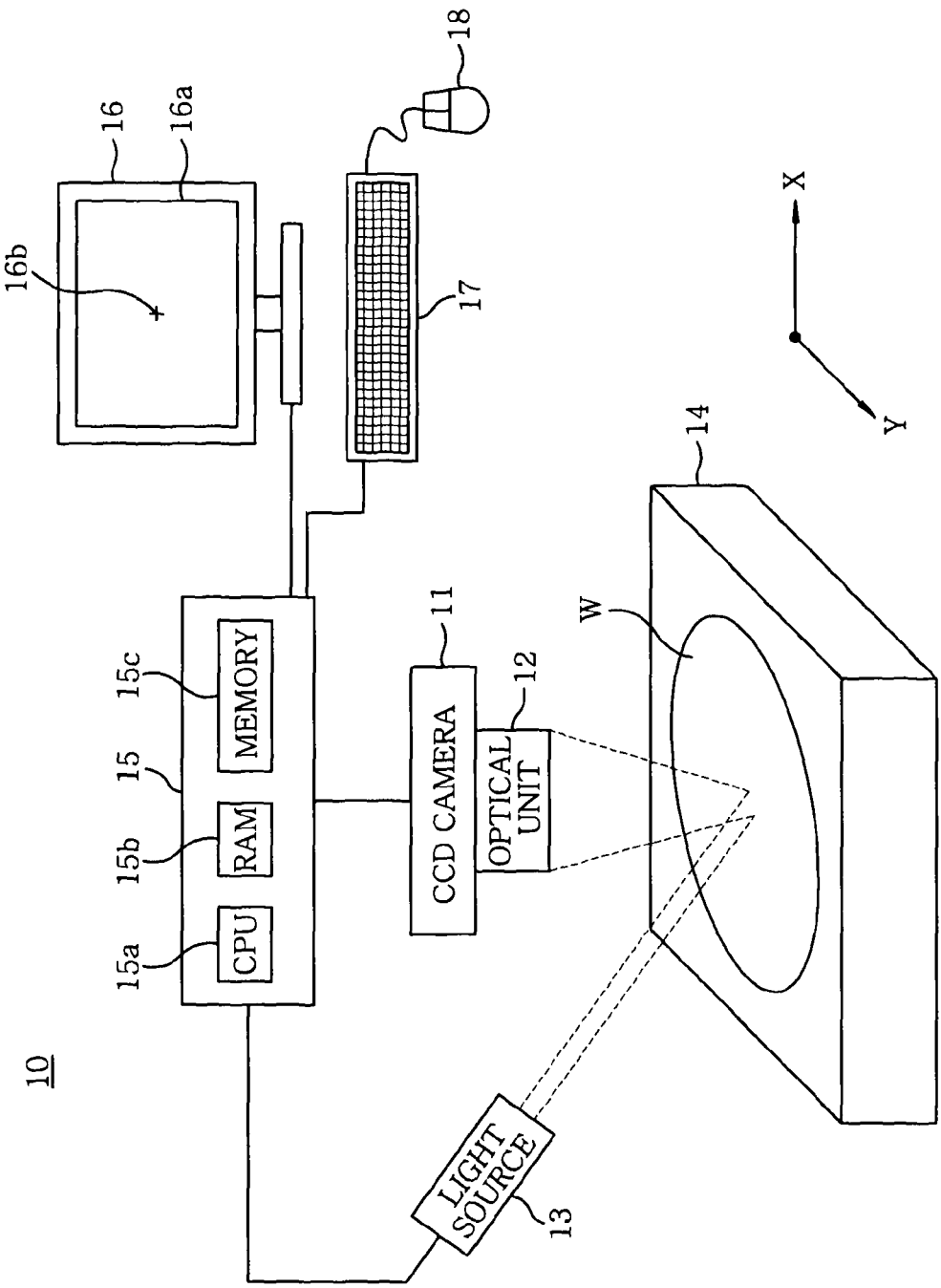
FIG. 1 illustrates a block diagram of a schematic configuration of the apparatus for detecting positions of electrode pads in accordance with an embodiment of the present invention.

FIG. 1 illustrates a block diagram of a schematic configuration of the apparatus for detecting positions of electrode pads in accordance with this embodiment.

As shown in FIG. 1, an electrode pad position detecting apparatus 10 includes: a CCD camera (imaging device) 11 for capturing an image of a semiconductor wafer W; an optical unit 12 for optically magnifying an object to be imaged by the CCD camera 11; a light source 13 for illuminating the object to be imaged by the CCD camera 11; a stage 14, disposed to face the CCD camera 11, for mounting thereon the semiconductor wafer W; and a computer 15 for controlling an operation of the above components.

Based on an imaging signal from the computer 15, the CCD camera 11 captures, as a two-dimensional image magnified by the optical unit 12, an image of a specific part of the semiconductor wafer W mounted on the stage 14, e.g., an image including a plurality of semiconductor chips 91 on the semiconductor wafer W or a plurality of electrode pads 92 of a semiconductor chip 91. Further, the CCD camera 11 outputs the two-dimensional image obtained by the imaging as an image signal to the computer 15. The CCD camera 11 is an imaging device using a black-and-white or a color charge coupled device (CCD) as an image sensor. However, instead of the CCD camera 11, there can be employed an imaging device using a metal oxide semiconductor (MOS) or an imaging device having a photoelectric conversion function.

The optical unit 12 has therein one or more lenses (not shown), thereby optically magnifying a specific part of the semiconductor wafer W and focusing an image of the magnified part on the CCD camera 11. The optical unit 12 is configured to have at least two magnifications. Specifically, the two magnifications include a magnification that allows a plurality of semiconductor chips 91 to be contained in a focused image (hereinafter, referred to as "magnification for imaging chips") and a magnification that allows a plurality of electrode pads 92 to be contained in a focused image (hereinafter, referred to as "magnification for imaging pads"), the magnification for imaging pads being greater than the magnification for imaging chips.

The light source 13 is a Xenon flash lamp for illuminating an object to be imaged by the CCD camera 11 fixed above the semiconductor wafer W. The light source 13 generates a flash of high brightness only for a short period of time, e.g., a few microseconds, from the time when it receives a flash signal which is output from the computer 15 right after the imaging signal is output therefrom. The flash illumination time is set to be very short compared to a conventional camera shutter speed (a few milliseconds), to thereby prevent an image from being shaken by the movement of the semiconductor wafer W which is an imaging object. Since the light source 13 emits a flash of high brightness only for a short period of time, an LED, a laser light source, or the like can be used as the light source 13. Besides, in this embodiment, a period of time from the output of the imaging signal to the output of the flash signal is so short that it can be ignored.

The stage 14 has a mounting table, provided at the upper side in the drawing, for directly mounting thereon a semiconductor wafer W; motors (e.g., stepping motors, servo motors, linear motors or the like) for moving the mounting table in X and Y directions in the drawing and for rotating the mounting table within an X-Y plane; and encoders (e.g., various motor encoders or linear scale encoders) for checking a moving distance of the mounting table in X and Y directions or a rotation angle thereof. The motor is driven to move the mounting table to a desired position while being controlled based on a motor control signal from the computer 15. Further, the encoder outputs an encoder signal in accordance with the movement and the rotation of the mounting table.

The computer 15 has a CPU (control unit) 15a, a RAM 15b and a memory 15c, and is connected with a display device 16, a keyboard 17 and a mouse 18 which is a pointing device. The display device 16 has a screen 16a, and a cross mark 16b is provided at the center of the screen 16a. The memory 15c stores therein a recipe (program) for an electrode pad detection process to be described later, and the corresponding recipe is loaded into the RAM 15b. The CPU 15a controls an operation of the CCD camera 11, the stage 14 or the like according to the recipe loaded into the RAM 15b, thereby performing the electrode pad detection process. In this recipe, data on dimensions of the semiconductor chips 91 or the like are set in advance. Further, the CPU 15a displays an image captured by the CCD camera 11 on the screen 16a of the display device 16, and sample positions and shapes of the electrode pads 92 or a split imaging target region 19 to be described later are set in accordance with an operator's input using the keyboard 17 or the mouse 18 on the screen 16a where the image is displayed.

The following is a description of a method for detecting positions of electrode pads in accordance with this embodiment.

Figure 2:
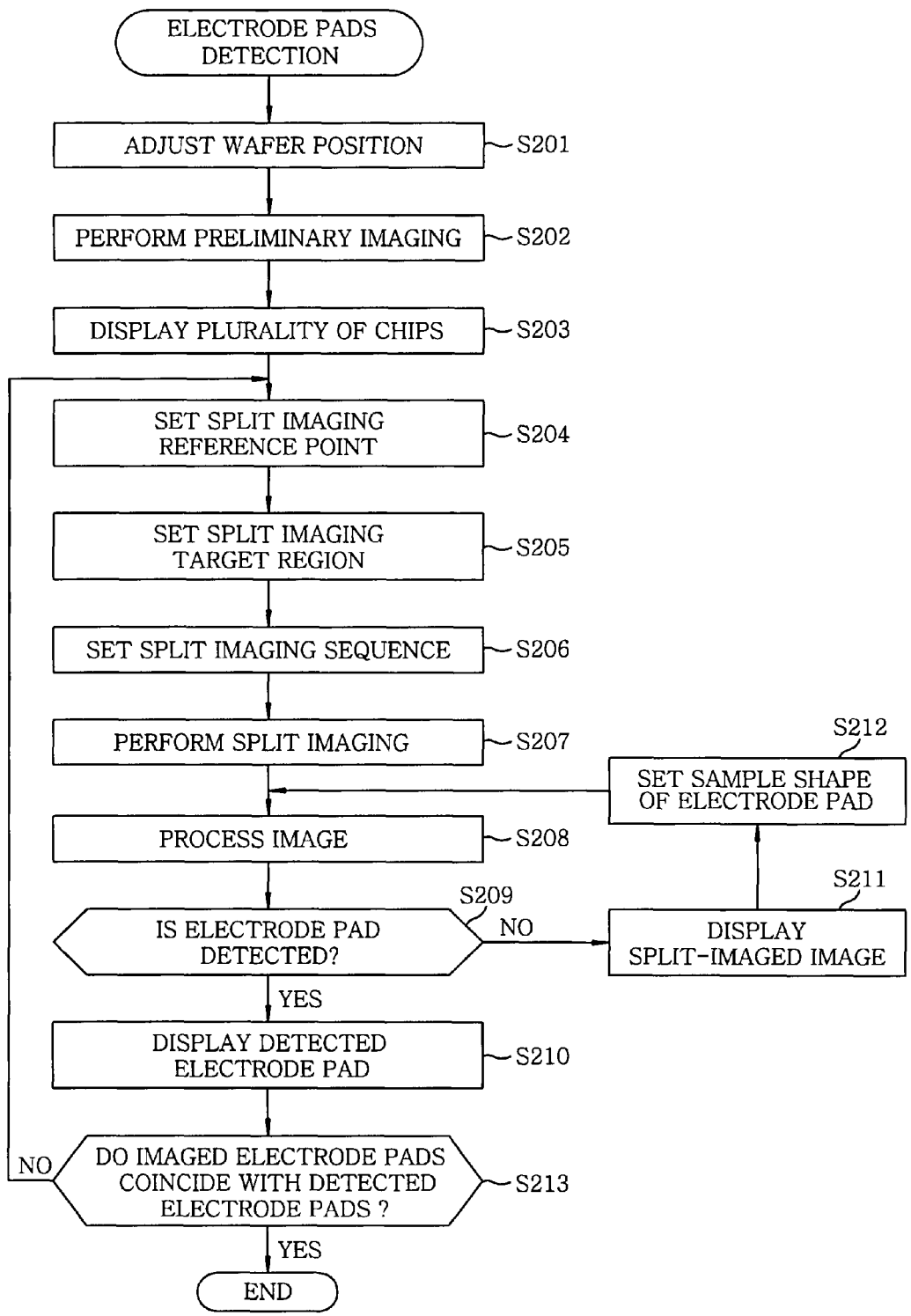
FIG. 2 illustrates a flowchart of an electrode pad detection process in a method for detecting positions of electrode pads in accordance with an embodiment of the present invention.

FIG. 2 illustrates a flowchart of an electrode pad detection process in a method for detecting positions of electrode pads in accordance with this embodiment.

Referring to FIG. 2, once the semiconductor wafer W is mounted on the stage 14, the CPU 15a rotates the semiconductor wafer W by using the mounting table so that lines and rows of the semiconductor chips 91 on the semiconductor wafer W are parallel to the X and Y directions of FIG. 1, respectively. Further, the CPU 15a moves the semiconductor wafer W by using the mounting table so that a reference semiconductor chip 91, e.g., a semiconductor chip 91 positioned at the center of the semiconductor wafer W faces the CCD camera 11. Accordingly, the position of the semiconductor wafer W is adjusted (step S201).

Figure 3A:
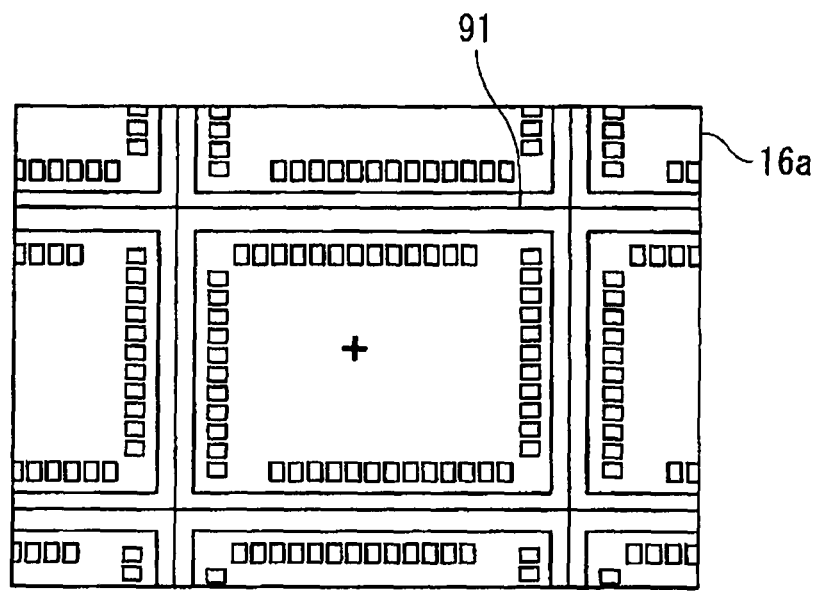

Next, the magnification of the optical unit 12 is set to the magnification for imaging chips, and the CCD camera 11 preliminarily captures an image of a specific region of the semiconductor wafer W (step S202). The CPU 15a displays the captured image of the region on the screen 16a of the display device 16 (step S203, region displaying step). At this time, since the preliminarily imaging is performed at the magnification for imaging chips, the displayed image includes a plurality of semiconductor chips 91 (FIG. 3A).

Figure 3B:
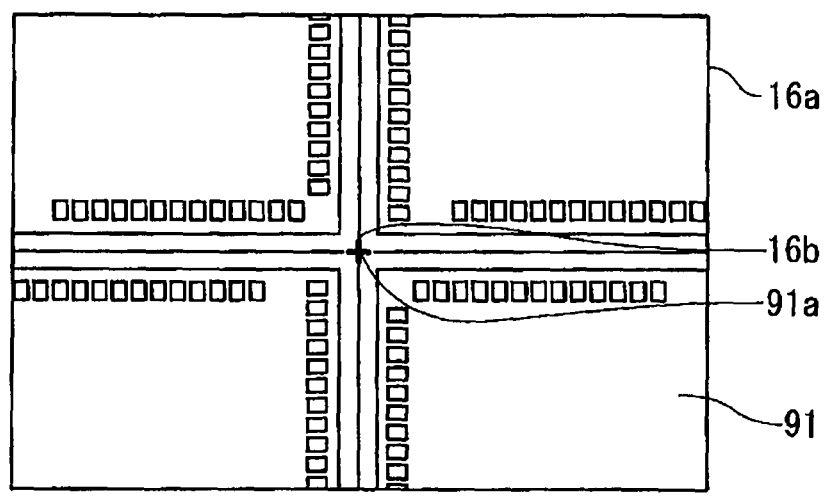
Figure 4A:
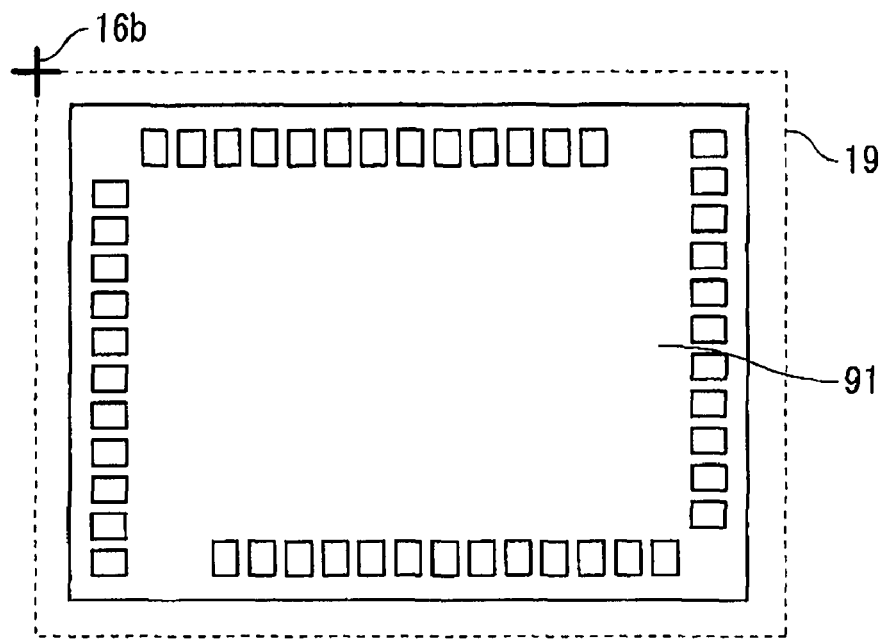

Thereafter, the operator moves the image displayed on the screen 16a of the display device 16 by using the mouse 18 so that a single vertex 91a of a semiconductor chip 91 which is an object of split imaging coincides with the cross mark 16b at the center of the screen 16a, thereby defining the corresponding vertex 91*a* as a reference point of the split imaging target region 19 (FIG. 3B). The CPU 15*a* sets the vertex 91*a* coinciding with the cross mark 16*b* as the reference point of the split imaging target region (region to be split-imaged) 19 (step S204), and also sets the split imaging target region 19 using the reference point and the data on dimensions of the semiconductor chip 91 which are preset in the recipe (step S205, region setting step, FIG. 4A).

Figure 4B:
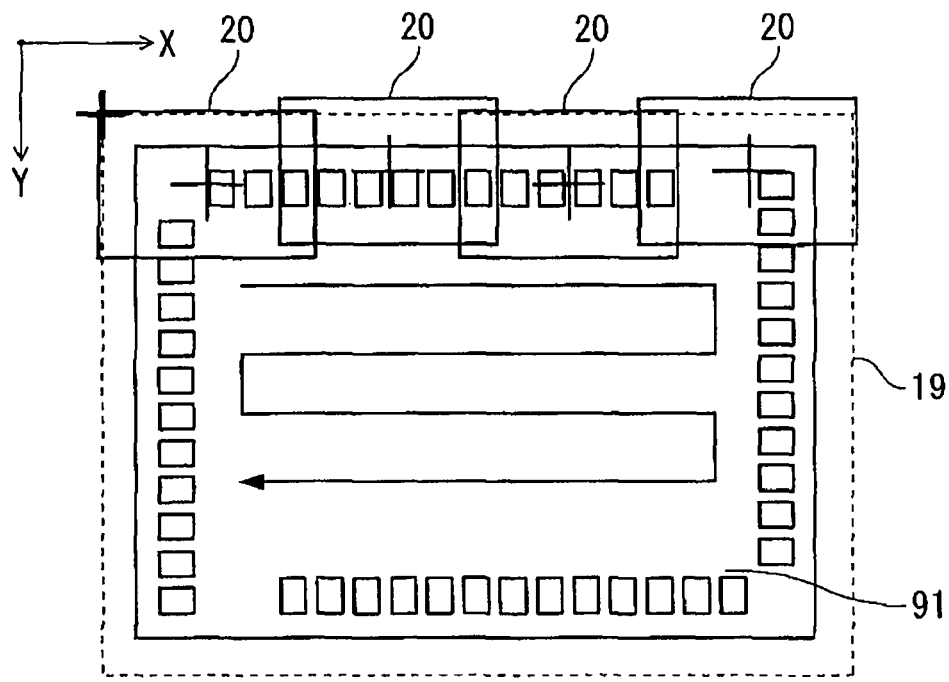

Then, the CPU 15*a* sets a split imaging sequence of the semiconductor chip 91 (step S206). Specifically, first of all, the CPU 15*a* calculates dimensions of a region that can be imaged by one imaging by the CCD camera 11 in case of setting the magnification of the optical unit 12 as the magnification for imaging pads. Then, the region that can be captured by one imaging is set as a split imaging region 20 (region to be captured by one imaging of split imaging). Next, a plurality of split imaging regions 20 are arranged in X and Y directions so that the split imaging target region 19 can be entirely covered by the plurality of split imaging regions 20 (FIG. 4B). Accordingly, the entire image of the semiconductor chip 91 can be obtained by combining the images of the split imaging regions 20. In FIG. 4B, only a part of the split imaging regions 20 is depicted for simplicity.

At this time, the adjacent split imaging regions 20 are arranged so that parts thereof are overlapped with each other, and overlap values between the adjacent split imaging regions 20 are set to be greater than dimensions of an electrode pad 92. More specifically, in case of the split imaging regions 20 adjacent to each other in the X direction, the overlap value is set to be greater than a length in the X direction of the electrode pad 92. Meanwhile, in case of the split imaging regions 20 adjacent to each other in the Y direction, the overlap value is set to be greater than a length in the Y direction of the electrode pads 92. Further, the CPU 15*a* sets an imaging sequence of the arranged split imaging regions 20. More specifically, the imaging sequence is set such that the split imaging proceeds in the Y direction in a zigzag scanning manner, as shown in FIG. 4B. The imaging sequence is not limited to the above but can be carried out in any other efficient scanning manner.

FIGS. 5A and 5B respectively illustrate a diagram for explaining a relationship between an overlap value of adjacent split imaging regions and a position of an electrode pad.

As shown in FIG. 5A, when edges 20*a* in the X direction of two adjacent split imaging regions 20 are not laid on an electrode pad 92, the image of the electrode pad 92 captured in any one of the two split imaging regions 20 is not divided in the X direction and, hence, it is not required to correct the shape of the electrode pad 92 in image processing to be described later.

Meanwhile, as shown in FIG. 5B, when an edge 20*a'* in the X direction of a split imaging region 20' is laid on an electrode pad 92', the image of the electrode pad 92' in the split imaging region 20' is divided in the X direction. If the image of the electrode pad 92' is divided, efforts are required to correct the shape of the electrode pad 92' in the image processing to be described later. However, in this embodiment, an overlap value T in the X direction of two adjacent split imaging regions 20' and 20" is set to be greater than a length t in the X direction of the electrode pad 92', so that the image of the electrode pad 92' in the split imaging region 20" is not divided in the X direction. Accordingly, it is not required to correct the shape of the electrode pad 92', thereby reducing the efforts required therefor.

Thereafter, according to the split imaging sequence set in the step S206, the CPU 15*a* sets the magnification of the optical unit 12 to the magnification for imaging pads, and performs split imaging of the split imaging target region 19 while controlling the operations of the CCD camera 11, the light source 13 and the stage 14 (step S207, split imaging step).

Next, the CPU 15*a* processes each image of the split imaging regions 20 obtained by the split imaging (step S208, position detecting step, shape detecting step), thus attempting to detect positions and shapes of the electrode pads 92 in the corresponding image. Here, the imaging processing is to detect a position or a shape of an object based on, e.g., a contrast of an image.

Figure 6A:
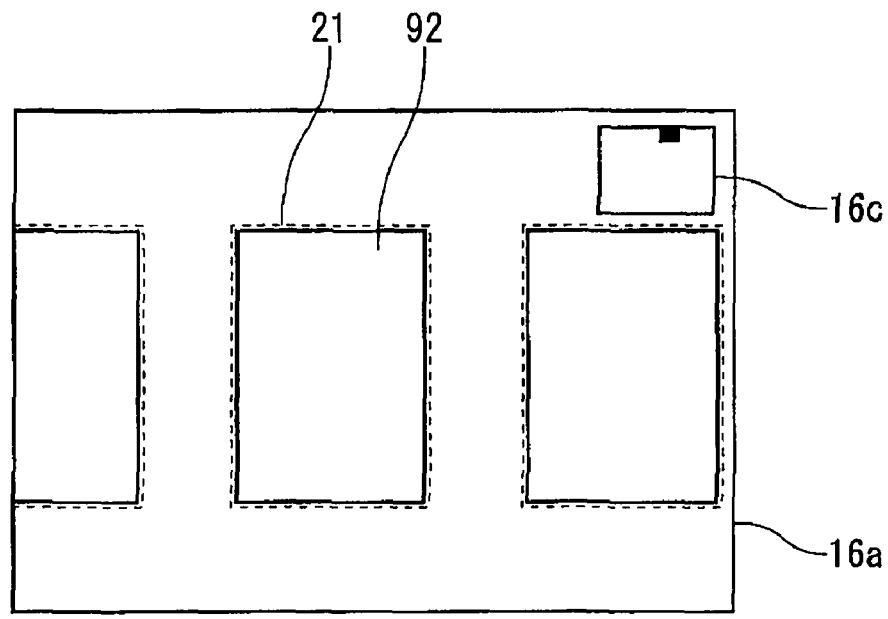

Then, in step S209, the CPU 15*a* determines whether or not it is possible to detect a position and a shape of an electrode pad 92 on each image of the split imaging regions 20. If the detection succeeds for the electrode pad 92, the image of the split imaging region 20 is further enlarged and displayed on the screen 16*a* and, also, the detected position and the shape of the electrode pad 92 is overlappedly displayed on the screen 16*a* by a contour 21 (indicated by a dashed line in FIG. 6A) (step S210, shape displaying step, overlap displaying step). Next, the process proceeds to step S213. At this time, the CPU 15*a* displays on a right upper part of the screen 16*a* a window 16*c* indicating to which part of the semiconductor chip 91 the region corresponding to the image enlarged and displayed on the screen 16*a* belongs.

Figure 6B:
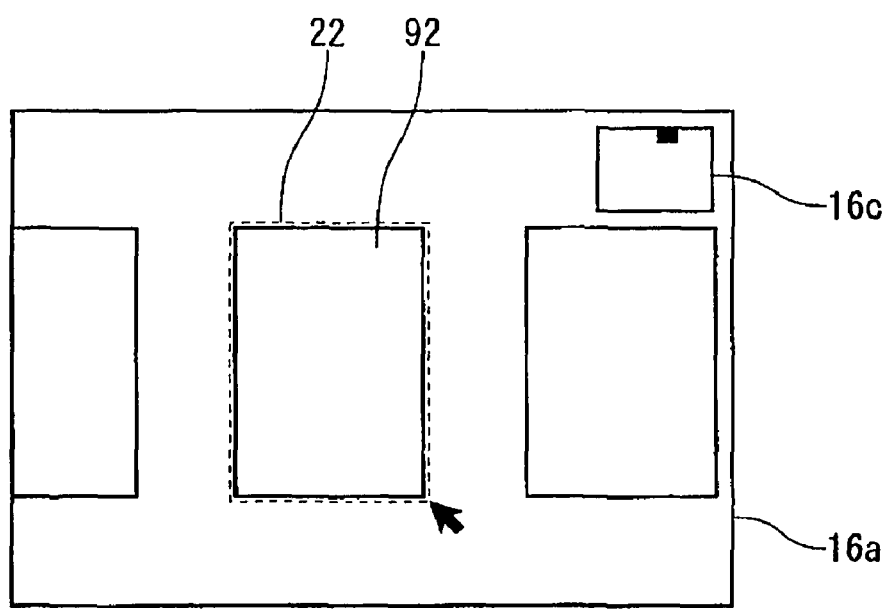

If the detection by the CPU 15*a* fails in the step S209, the corresponding image of the split imaging region 20 is also enlarged and displayed on the screen 16*a* (step S211). At this time, the CPU 15*a* displays the window 16*c* on the screen 16*a* as in the step S210. The operator checks the position and the shape of the electrode pad 92 on the screen 16*a*, and uses the mouse 18 to define the region corresponding to the electrode pad 92 on the screen 16*a* by a contour 22 (FIG. 6B). The CPU 15*a* sets the position and the shape of the defined region as the sample position and shape of the electrode pad 92 (step S212), and performs again the image processing on the corresponding image of the split imaging region 20 with reference to the sample position and shape (the step S208), thus attempting to detect the position and the shape of the electrode pad 92 in the corresponding image.

Next, in step S213, the CPU 15*a* displays on the screen 16*a* the entire image of the semiconductor chip 91, and also overlappedly displays on the screen 16*a* the detected positions and shapes of all the electrode pads 92 by the contours 21 (entire chip overlap displaying step). The operator checks the screen 16*a* and inputs to the computer 15 through the keyboard 17 or the mouse 18 whether or not the positions and shapes of all the imaged electrode pads 92 coincide with the positions and shapes of all the detected electrode pads 92. Based on the corresponding input, the CPU 15*a* determines whether or not the positions and shapes of all the imaged electrode pads 92 coincide with the positions and shapes of all the detected electrode pads 92.

In the step S213, if it is determined that the positions and shapes of all the imaged electrode pads 92 do not coincide with the positions and shapes of all the detected electrode pads 92, the process proceeds to the step S204. Otherwise, this process is completed.

Referring to the processes of FIG. 2, the split imaging of the split imaging target region 19 greater than the semiconductor chip 91 is carried out, and the positions of the electrode pads 92 are detected by processing the images of the split imaging regions 20 obtained by the split imaging. Accordingly, the positions of the electrode pads 92 can be detected without defining them in the images by a mouse or the like. Moreover, the split imaging target region 19 is entirely covered by a plurality of split imaging regions 20, so that all the electrode pads 92 of the semiconductor chip 91 are included in the plurality of split imaging regions 20. From the above, it is possible to easily detect the positions of all the electrode pads 92 of the semiconductor chip 91.

In the processes of FIG. 2, the image of the region including a plurality of semiconductor chips 91 is displayed, and a single vertex 91a of a semiconductor chip 91 on the displayed image is set as a reference point of the split imaging target region 19. Further, the split imaging target region 19 is set by using the reference point and the data on dimensions of the semiconductor chip 91 which are preset in the recipe. At this time, the labor of the operator can be decreased because the operator only needs to define the single vertex 91a as the reference point of the split imaging target region 19 by making the single vertex 91a of the semiconductor chip 91 coincide with the cross mark 16b on the screen 16a of the display device 16.

Moreover, in the processes of FIG. 2, the shapes of all the electrode pads 92 are detected by processing the images of the split imaging regions 20 obtained by the split imaging. As a result, the shapes of all the electrode pads 92 can be easily detected.

In the processes of FIG. 2, the contours 21 indicating the detected positions and shapes of the electrode pads 92 are overlappedly displayed on the screen 16a with the images obtained by further enlarging the images of the split imaging regions 20. Thus, the operator can easily determine whether or not the positions and shapes of the electrode pads 92 are accurately detected and, also, whether or not the CPU 15a erroneously detects other parts as the electrode pads 92.

Furthermore, in the processes of FIG. 2, the contours 21 indicating the detected positions and shapes of all the electrode pads 92 are overlappedly displayed on the screen 16a with the entire image of the semiconductor chip 91. As a consequence, the operator can easily determine whether or not the positions of the electrode pads 92 as well as the shapes thereof are accurately detected.

Besides, in the processes of FIG. 2, when the split imaging sequence of the semiconductor chip 91 is set, the adjacent split imaging regions 20 are set so that parts thereof are overlapped with each other. Therefore, the split imaging of the split imaging target region 19 is performed so that the parts of the images of the adjacent split imaging regions 20 are overlapped with each other. Accordingly, the entire split imaging target region 19 can be imaged without skipping parts thereof and, hence, the positions of all the electrode pads 92 of the semiconductor chip 91 can be accurately detected. Further, the overlap values between the adjacent split imaging regions 20 are greater than the lengths of an electrode pad 92 in the X and the Y direction, so that the electrode pad 92 is not divided in at least one of the images of the adjacent split imaging regions 20. As a result, it is not required to correct the shapes of the electrode pads 92 in the image processing, thereby reducing the efforts required therefor.

Figure 7A:
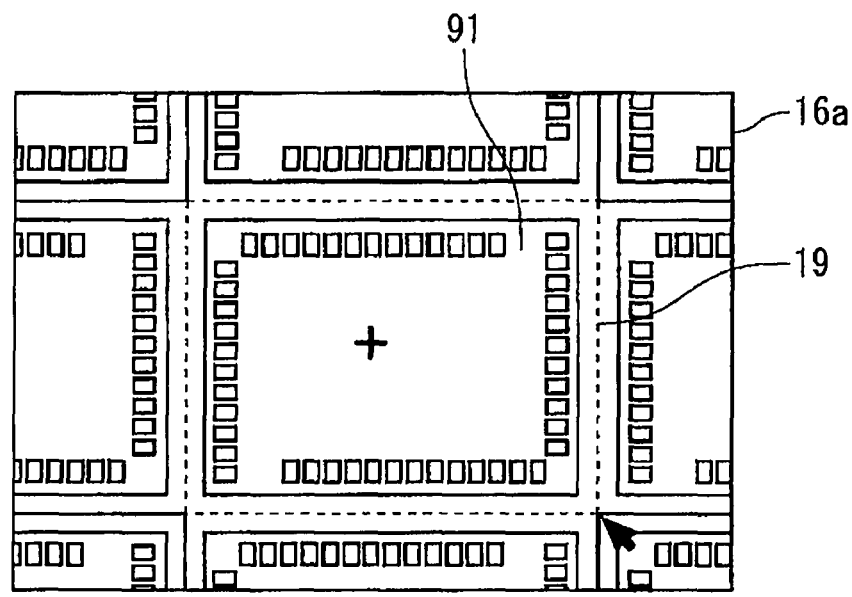

Referring to the processes of FIG. 2, in the step S204, the vertex 91a coinciding with the cross mark 16b is set as the reference point of the split imaging target region 19 and, also, the split imaging target region 19 is set by using the reference point and the data on dimensions of the semiconductor chip 91 which are preset in the recipe. However, the method for setting the split imaging target region 19 is not limited to the above. For example, the operator surrounds, on the screen 16a by using the mouse 18, a region corresponding to a semiconductor chip 91 which is an object of split imaging (FIG. 7A), and the CPU 15a sets the defined region as the split imaging target region 19. At this time, the operator only needs to surround the region corresponding to the semiconductor chip 91 by using the mouse 18 and, hence, the labor of the operator can be reduced.

Figure 7B:
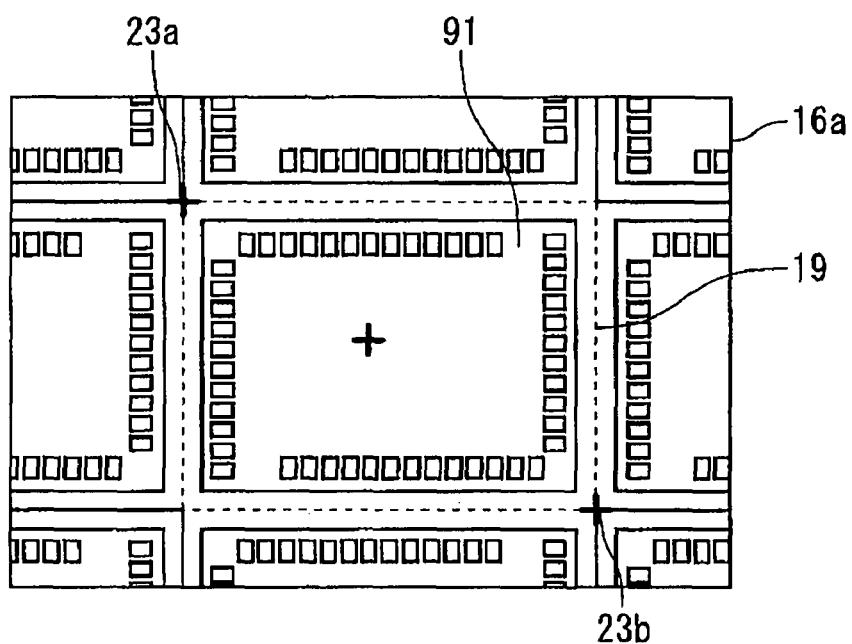

Alternatively, for example, the operator designates on the screen 16a two points 23a and 23b on a semiconductor chip 91 which is an object of split imaging (FIG. 7B), and the CPU 15a sets the split imaging target region 19 by defining the two points 23a and 23b as two diagonal points of the rectangular region corresponding to the semiconductor chip 91. At this time, the labor of the operator can be decreased because the operator only needs to designate two points on the screen 16a.

Figure 8:
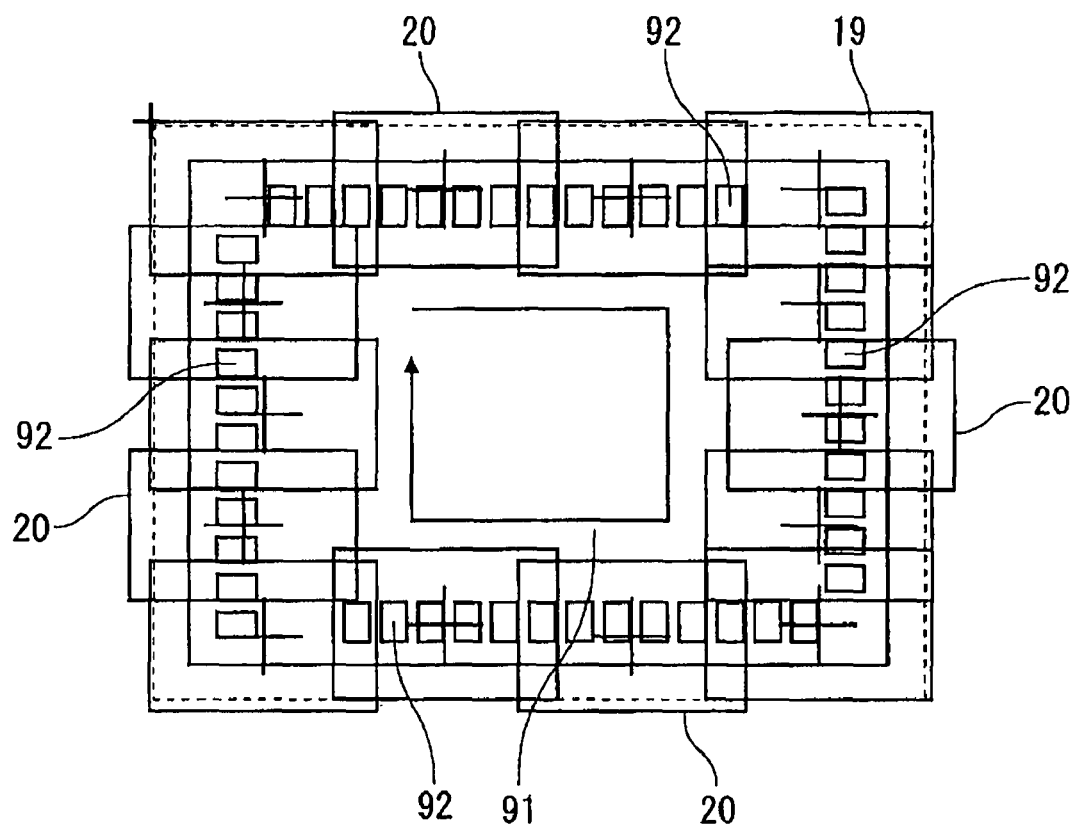
FIG. 8 illustrates an arrangement of a plurality of split imaging regions in a modified example of a split imaging sequence.
Figure 9A:
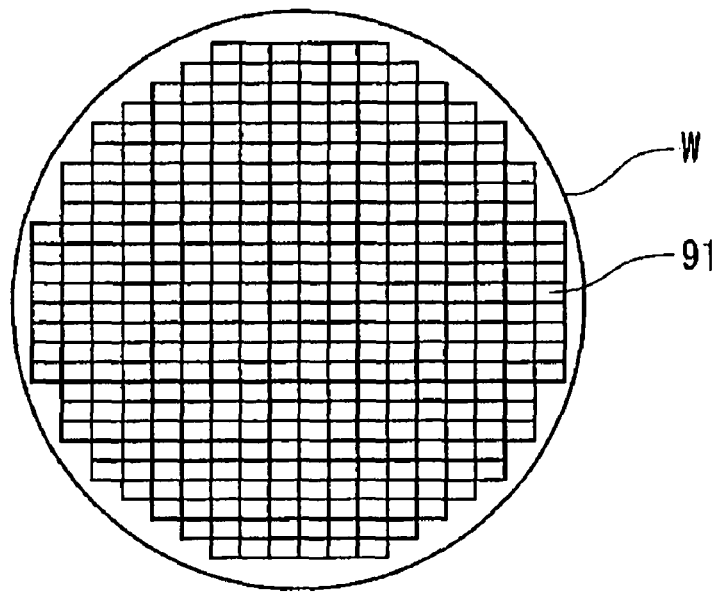
Figure 9B:
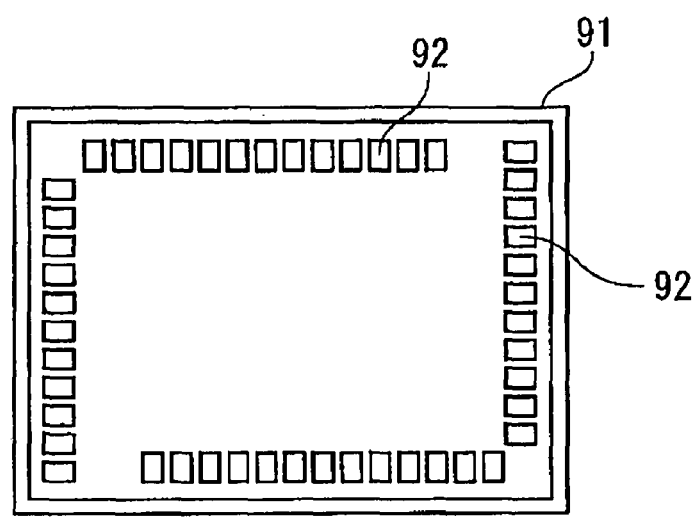
Figure 9C:
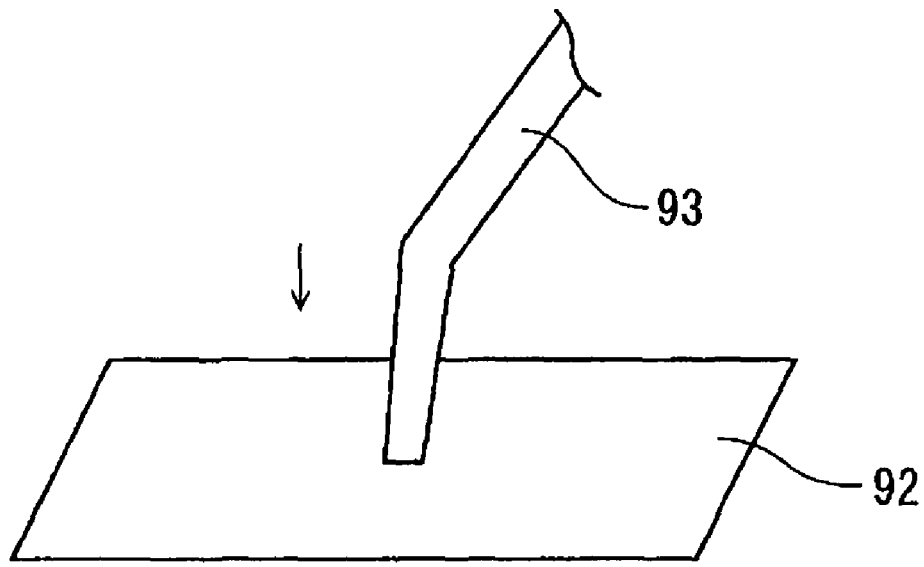
Figure 9D:
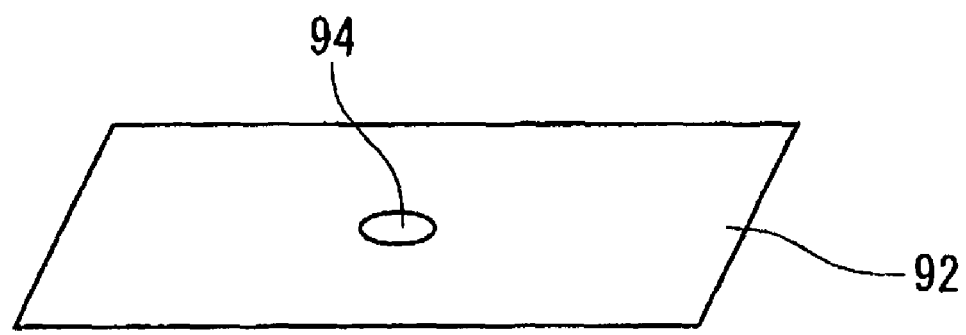

In the processes of FIG. 2, when the split imaging sequence of the semiconductor chip 91 is set, a plurality of split imaging regions 20 are arranged so that the split imaging target region 19 is entirely covered. However, approximate position information of electrode pads 92 in the semiconductor chip 91 can be preset in the recipe, and a plurality of split imaging regions 20 can be arranged based on the position information so that only parts of the split imaging target region 19 are covered by the split imaging, the parts having high existence probabilities of the electrode pads 92 (FIG. 8). Accordingly, the split imaging can be efficiently performed.

In the above-described embodiment, the electrode pad position detecting apparatus 10 is configured as a stand-alone unit. However, an apparatus same as the electrode pad position detecting apparatus 10 can be installed in a prober or a wafer inspection apparatus. Further, the electrode pad 92 can be formed in a spherical shape or a polygonal shape without being limited to a rectangular shape.

It is to be understood that the object of the present invention may also be accomplished by supplying a computer with a storage medium storing a program code of software that realizes the functions of the embodiment described above, and then causing a CPU of the computer to read out and execute the program code stored in the storage medium.

In this case, the program code itself read out from the storage medium realizes the functions of the embodiment described above, and hence the program code and the storage medium storing the program code form the present invention.

The storage medium for supplying the program code may be, for example, a RAM, an NV-RAM, a floppy (registered trademark) disk, a hard disk, a magnetic-optical disk, an optical disk such as a CD-ROM, a CD-R, a CD-RW, or a DVD (a DVD-ROM, a DVD-RAM, a DVD-RW, or a DVD+RW), a magnetic tape, a nonvolatile memory card, a ROM, or any other storage medium in which the program code can be stored. Alternatively, the program code may be supplied to the computer by being downloaded from a database or another computer (not shown) connected to the Internet, a commercial network, a local area network, or the like.

Moreover, it is to be understood that the functions of the embodiment described above may be accomplished not only by executing a program code read out by a computer, but also by causing an OS (operating system) or the like which operates on the CPU to perform a part or all of the actual operations based on instructions of the program code.

Furthermore, it is to be understood that the functions of the embodiment described above may also be accomplished by writing a program code read out from a storage medium into a memory provided on an extension board inserted into a computer or in an extension unit connected to the computer and then causing a CPU or the like provided on the extension board or in the extension unit to perform a part or all of the actual operations based on instructions of the program code.

The form of the program code may be an object code, a program code performed by using an interpreter, script data supplied to an OS, or the like.

While the invention has been shown and described with respect to the embodiments, it will be understood by those skilled in the art that various changes and modification may be made without departing from the scope of the invention as defined in the following claims.

What is claimed is:

1. A method for detecting positions of a plurality of electrode pads of semiconductor chips formed on a semiconductor wafer, the method comprising:
   setting an imaging target region greater than a semiconductor chip on the semiconductor wafer;
   performing split imaging so as to entirely cover the imaging target region by using an imaging device which enlarges and images a region smaller than the imaging target region by one imaging; and
   detecting positions of electrode pads of the semiconductor chip by processing images obtained by the split imaging.

2. The method for detecting positions of electrode pads of claim 1, further comprising:
   capturing, before setting the imaging target region, an image of a region including at least the semiconductor chip and displaying the captured image of the region,
   wherein in setting the imaging target region, a single point corresponding to the semiconductor chip on the displayed image is set as a reference point of the imaging target region, and the imaging target region is set based on the set reference point and preset data on dimensions of the semiconductor chip.

3. The method for detecting positions of electrode pads of claim 1, further comprising:
   capturing, before setting the imaging target region, an image of a region including at least the semiconductor chip and displaying the captured image of the region,
   wherein in setting the imaging target region, the imaging target region is set to a region surrounding the semiconductor chip on the displayed image.

4. The method for detecting positions of electrode pads of claim 1, further comprising:
   capturing, before setting the imaging target region, an image of a region including at least the semiconductor chip and displaying the captured image of the region,
   wherein in setting the imaging target region, the imaging target region is set by using two designated points on the displayed image as two diagonal points of a rectangular region corresponding to the semiconductor chip.

5. The method for detecting positions of electrode pads of claim 1, further comprising:
   detecting shapes of the electrode pads by processing the images obtained by the split imaging.

6. The method for detecting positions of electrode pads of claim 5, further comprising:
   displaying the detected shapes of the electrode pads.

7. The method for detecting positions of electrode pads of claim 5, further comprising:
   overlappedly displaying the detected shapes of the electrode pads with the images obtained by the split imaging.

8. The method for detecting positions of electrode pads of claim 5, further comprising:
   overlappedly displaying the detected shapes of the electrode pads with an entire image of the semiconductor chip.

9. The method for detecting positions of electrode pads of claim 1, wherein in performing the split imaging, at least parts of the adjacent regions to be split-imaged are overlapped with each other.

10. The method for detecting positions of electrode pads of claim 9, wherein overlap values between the adjacent regions to be split-imaged are greater than dimensions of the electrode pad.

11. An apparatus for detecting positions of a plurality of electrode pads of semiconductor chips formed on a semiconductor wafer, the apparatus comprising:
    a control unit for setting an imaging target region greater than a semiconductor chip on the semiconductor wafer; and
    an imaging device for enlarging and imaging a region smaller than the imaging target region by one imaging,
    wherein the imaging device performs split imaging so as to entirely cover the imaging target region, and the control unit detects positions of electrode pads of the semiconductor chip based on the images obtained by the split imaging.

* * * * *